United States Patent

Williams et al.

[11] 4,052,119
[45] Oct. 4, 1977

[54] CRYSTALS FOR RECORDING PHASE HOLOGRAMS

[75] Inventors: Brown F. Williams, Princeton; William Joseph Burke, Princeton Junction; William Phillips, Princeton; David Lloyd Staebler, Lawrenceville, all of N.J.

[73] Assignee: RCA Corporation, New York, N.Y.

[21] Appl. No.: 671,598

[22] Filed: Mar. 29, 1976

[51] Int. Cl.² ............ G03H 1/02; G03C 1/00; G11B 7/24
[52] U.S. Cl. .................... 350/3.5; 96/27 H; 252/501
[58] Field of Search .......... 350/3.5, 150; 96/27 H; 340/173 LT, 173 LS; 252/501

[56] References Cited

U.S. PATENT DOCUMENTS 3,915,549  10/1975  Amodei .................. 350/3.5

OTHER PUBLICATIONS

Williams et al., *Applied Physics Letters*, vol. 28, No. 4, Feb. 1976, pp. 224–226.
Staebler et al., *Applied Physics Letters*, vol. 26, No. 4, Feb. 1975, pp. 182–184.
Okamoto et al., *Applied Optics*, vol. 14, No. 10, Oct. 1975, pp. 2453–2455.

*Primary Examiner*—Ronald J. Stern
*Attorney, Agent, or Firm*—H. Christoffersen; Birgit E. Morris; Joseph T. Harcarik

[57] ABSTRACT

Single crystal electro-optic material useful for recording phase holograms comprises lithium niobate or lithium tantalate doped with iron and silicon.

4 Claims, 1 Drawing Figure

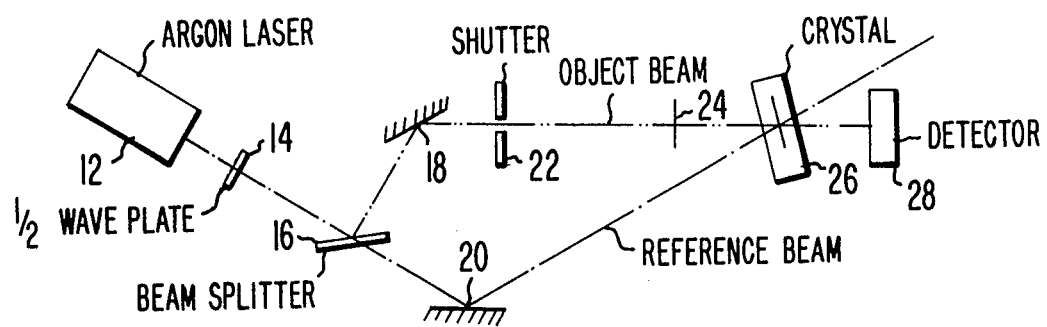

CRYSTALS FOR RECORDING PHASE HOLOGRAMS

The invention herein described was made in the course of or under a contract with the U.S. Government.

BACKGROUND OF THE INVENTION

U.S. Pat. Nos. 3,773,400 and 3,915,549, and OPTICAL AND HOLOGRAPHIC STORAGE PROPERTIES OF TRANSITION METAL DOPED LITHIUM NIOBATE by William Phillips, J. J. Amodei and D. L. Staebler, RCA Reveiw, March, 1972, Vol. 33, No. 1, describe lithium niobate and lithium tantalate crystals doped with iron and are herein incorporated by reference. Volume phase holograms can be recorded in these crystals by changing the index of refraction of selected areas of the crystals with coherent light.

When a hologram is recorded at temperatures of about 160° C in iron doped lithium niobate crystals ionic compensation occurs at essentially the same rate as the electronic space-charge pattern is formed, or more briefly, the hologram is fixed as fast as it is written. By fixing we mean that the recorded hologram can not be erased at room temperature by exposure to either coherent or incoherent light. If recording is done at lower recording temperatures, slower ionic compensation rates allow build-up of electric fields which in turn lead to spurious optical scattering from imperfections in the recording beam or crystal. This results in an image of lower quality. If recording is done at higher recording temperatures, the effects of thermal erasure are more pronounced. This leads to lower diffraction efficiency. During thermal erasure the thermal ionization of electrons in the trapped electronic space pattern formed during recording causes redistribution of those thermally ionized electrons by diffusion, thus reducing the magnitude of the electronic space charge pattern.

SUMMARY OF THE INVENTION

We have found that a single crystal useful for recording phase holograms is comprised of lithium niobate or lithium tantalate prepared by doping the crystal with iron and silicon. These crystals can record holograms which fix as fast as they are written at recording temperatures below 160° C. The adverse effects related to spurious scattering are suppressed and image quality is maintained with an accompanying increase in hologram diffraction efficiency or, alternatively, an increase in hologram recording capacity due to reduced thermal erasure.

BRIEF DESCRIPTION OF THE DRAWINGS

The FIGURE is a schematic drawing of a system useful for recording and reading holographic information in an electro-optic crystal and for testing the sensitivity of the diffraction efficiency of the electro-optic crystal.

DETAILED DESCRIPTION OF THE INVENTION

According to the present invention, additionally doping an iron doped lithium niobate or lithium tantalate crystal with silicon reduces the temperature at which fixing will occur as fast as holographic writing. Since recording can then occur at a lower temperature with adequate fixing and surpressed effects from spurious scattering, the quality of the image can be maintained.

Typically iron-doped lithium niobate crystals contain about 1-5 ppm (parts per million by weight) of silicon as a trace contaminant, as ascertained by emission spectroscopy. It is believed this trace amount provides the silicon required to allow fixing as fast as writing at recording temperatures of about 160° C and above.

In order to provide fixing at rates as fast as writing at temperatures below 160° C, the iron-doped lithium niobate crystals are additionally doped with from 10 ppm to 300 ppm of silicon, and, preferably with from 50 ppm to 250 ppm of silicon. With respect to silicon, the doped amount refers to the additional silicon added to the crystal in addition to the trace silicon concentration.

Iron-doped lithium niobate crystals which contain about 1-5 ppm of silicon will record holograms that fix as fast as they are written at temperatures of about 150° to about 110° C when additionally doped with from about 10 ppm to about 300 ppm silicon. The higher the silicon concentration, the lower the temperature at which recording and simultaneous fixing will occur.

Reducing the recording temperature from 160° to about 140° C decreases the rate of thermal erasure by a factor of up to about 7. With reduced thermal erasure, the hologram diffraction efficiency can be increased. As an alternative to increased diffraction efficiency, increased recording capacity can be obtained by keeping the diffraction efficiency constant. Typically, the range of iron doping is from 0.005 mole percent Fe to 0.25 mole percent Fe. A preferred range of iron doping is from 0.01 to 0.1 mole percent of iron. The iron doping ranges refer to the iron concentration in the doped lithium niobate crystal.

The novel iron- and silicon-doped lithium niobate crystals of the present invention may be prepared by the Czochralski crystal growing technique as well as other known methods, such as a diffusion technique subsequent to crystal growth.

A typical procedure for preparing iron- and silicon-doped lithium niobate crystals is as follows: About one mole each of Grade 1 lithium carbonate and niobium pentoxide (United Mineral and Chemical Company) are mixed intimately and added a little at a time to a 100 cc platinum crucible. After each addition, the mixture is melted. The crucible is eventually filled to about 80 percent of its capacity. Iron in the form of iron oxide ($Fe_2O_3$) and silicon in the form of $SiO_2$, $Li_2SiO_3$, or similar materials, is added during the final stages of filling. The filled crucible is placed in a resistance-heated growing furnace. The melt is brought to a temperature of approximately 1260° C, where growth is initiated on a c-axis oriented seed crystal. Other seed orientations, however, may also be employed. The crystal is pulled from the melt at a rate which is typically about 5 mm per hour. It is preferred to rotate the crystal while it is being pulled. Rotation rates of 12 to 30 rpm may be employed. Crystals are grown in this manner to a diameter of from 10 to 15 mm. An electric current of 5 to 10 mA can be maintained from the seed to the melt throughout the entire growth by means of a high impedance power supply in order to pole the crystals.

Typically, crystal growth is terminated after 2.5 to 3 cm of growth, whereupon the crucible is then lowered into a well in the bottom of the furnace. The grown crystal is then lowered into the center part of the furnace where it is annealed in a nearly isothermal environment. Typical anneal parameters are 1100° C for 4 to 5 hours. Following the annealing, the crystal is cooled to room temperature at about 50° C per hour. The grown crystal may be mounted and sliced with a diamond saw so as to obtain optical samples therefrom.

The concentration of the silicon in the doped crystal is some fraction of the silicon concentration in the crystal melt. It is necessary to add a greater concentration of silicon in the melt than the desired concentration of silicon in the grown crystal. In some cases the silicon concentration in the melt will be as much as ten times the silicon concentration in the grown crystal.

An alternative method for preparing iron- and silicon-doped lithium niobate crystal is to evaporate a film of silicon on the crystal and to heat treat the resultant crystal so as to cause diffusion of the silicon into the crystal. For example, a 20-mil-thick wafer of iron doped lithium niobate may be doped with silicon by evaporating a 500 to 2500 angstrom thick silicon film thereon and heat treating at 1100° C for about 48 hours in a vacuum. Following this treatment the crystal can be re-oxidized by annealing it in oxygen or a mixture of oxygen and argon.

Phase holograms are recorded in iron- and silicon-doped lithium niobate ($LiNbO_3$) by photo excitation of electrons trapped at $Fe^{3+}$ sites with subsequent drift or diffusion of the electrons from regions of high light intensity in the interference pattern of the light beams into regions of low light intensity and retrapping at $Fe^{3+}$ sites. Through this process a trapped electronic space charge pattern is formed which mirrors the original light intensity pattern. This space charge pattern modulates the index of refraction through the electro-optic effect producing a phase grating. The holograms are fixed by heating the crystal in which the hologram is stored to between 100° to 200° C. This heating allows a transport of mobile silicon ions which neutralize the electronic space charge pattern. Upon cooling the exposed crystal to room temperature and redistributing the electronic space charge pattern with incoherent light, a hologram due to the ionic space charge pattern remains.

Referring to the FIGURE, there is shown schematically a system useful for recording and reading holographic information in an electro-optic crystal of the invention. The system comprises an argon laser 12 which emits coherent light at a wavelength of 4880 angstroms. Other lasers, however, can be employed. This light passes through a one-half wave plate 14 to obtain coherent light which is horizontally polarized. The light then passes through a beam splitter 16. A portion of the light is reflected from the beam splitter onto a first mirror 18 and the other portion of the radiation passes through the beam splitter onto a second mirror 20. The mirrors 18 and 20 are adjusted such that the plane polarized beams reflected from them meet at an angle of about 30°. The portion of the beam which is reflected from the beam splitter is termed the object beam and after being reflected from the mirror 18 passes through a shutter 22 and then through the object 24. The portion of the beam which passes through the beam splitter 16 is termed the reference beam. The reference beam and object beam intersect to form the interference pattern. The electro-optic crystal 26 is positioned at the intersection of the reference and object beams with the crystallographic c-axis perpendicular to the bisector of the angle between the reference and object beams, and in the plane of incidence of these beams.

The recorded holographic pattern is readout by closing the shutter, thereby blocking the object beam and allowing only the reference beam to impinge on the crystal. An image of the object will thereby be formed and may be viewed either spatially or on a detector 28 which can, for example, be a silicon solar cell array, an image screen, television camera and the like.

We claim:
1. A single crystal useful for recording phase holograms which comprises a crystal selected from the group consistng of lithium niobate and lithium tantalate, said crystal prepared by doping with iron and from 50 to 300 parts per million of silicon wherein said crystal contains from 0.005 to 0.25 mole percent of iron.

2. In a system for recording phase holograms comprising a laser, means for forming an object beam and a reference beam and means for recording the interference pattern formed by combining said object beam and said reference beam wherein said recording means comprises a single crystal selected from the group consisting of lithium niobate and lithium tantalate, said crystal doped with iron and from 50 to 300 parts per million of silicon wherein said crystal contains from 0.005 to 0.25 mole percent of iron.

3. A method for recording phase holograms which comprises illuminating selected portions of a holographic recording crystal so as to alter the refractive index of said selected portions and detecting the changes in refractive index wherein the holographic recording crystal comprises a single crystal selected from the group consisting of lithium niobate and lithium tantalate, said crystal doped with iron and from 50 to 300 parts per million of silicon wherein said crystal contains from 0.005 to 0.25 mole percent of iron.

4. A method according to claim 3 wherein said crystal will fix a hologram as fast as the hologram is written at recording temperatures below 160° C.

* * * * *